United States Patent [19]

Geller

[11] Patent Number: 5,017,886
[45] Date of Patent: May 21, 1991

[54] RF POWER COMBINER USING BALUNS

[75] Inventor: Bernard D. Geller, Rockville, Md.

[73] Assignee: Comsat, Washington, D.C.

[21] Appl. No.: 449,694

[22] Filed: Dec. 12, 1989

[51] Int. Cl.$^5$ ............................ H03F 3/26; H03F 3/68
[52] U.S. Cl. ...................................... 330/277; 330/55; 330/295
[58] Field of Search ...................... 330/55, 124 R, 269, 330/277, 295; 333/25, 26

[56] References Cited

U.S. PATENT DOCUMENTS

| | | | |
|---|---|---|---|
| 4,097,814 | 6/1978 | Cohn | 330/286 |
| 4,291,278 | 9/1981 | Quine | 330/286 |
| 4,305,043 | 12/1981 | Ho et al. | 330/53 |
| 4,386,324 | 5/1983 | Schellenberg | 330/277 |
| 4,466,445 | 5/1984 | Apel | 330/269 |
| 4,549,152 | 10/1985 | Kumar | 330/124 R |
| 4,588,962 | 5/1986 | Saito et al. | 330/286 |
| 4,619,001 | 11/1986 | Kane | 455/192 |
| 4,647,867 | 3/1987 | Butler et al. | 330/269 |
| 4,647,868 | 3/1987 | Mueller | 330/295 X |

OTHER PUBLICATIONS

Ikeda, "Development of a Solid State Radio Transmitter with MOS/FET", IEEE Transactions on Broadcasting, vol. BC-26, No. 4, Dec. 1980, pp. 99–112.

*Primary Examiner*—James B. Mullins
*Attorney, Agent, or Firm*—Sughrue, Mion, Zinn, Macpeak & Seas

[57] ABSTRACT

An RF power combiner combines the power of several microwave high power FET amplifiers. A plurality of baluns which convert a balanced transmission line to an unbalanced transmission line and have outputs which are 180° out of phase from each other may be connected at the inputs and the outputs of the FETs. This connection allows for very high output power while matching impedances of the input and the output of the power combiner. Additionally, loss in the output circuit can be minimized by connecting equi-phase outputs of the FETs in a parallel/push-pull manner.

11 Claims, 3 Drawing Sheets

RF POWER COMBINER USING BALUNS

BACKGROUND OF THE INVENTION

The present invention relates to RF power combining. and more particularly to combining the power of several microwave high power FET amplifiers using baluns.

A balun is a two port circuit which efficiently transforms an unbalanced (with respect to ground) transmission mode, such as coax or microstrip, to a balanced mode such as twin-lead or twin strip. The primary requirement of the balun is that two terminals in the balanced port be 180° apart in phase and equal in amplitude. Baluns can be formed using several different methods.

Microwave solid state high power amplifiers and monolithic microwave integrated circuits (MMICs) is a very fast-developing area of technology. Applications for these components range from communications satellite transmitters to military radars, communications and SDI. FETs are currently limited to an output power in the range of a few watts, mainly due to the rapid decrease of input impedance as total gate width is increased. As the input impedance is reduced, greater matching circuit losses are incurred with the resultant decrease in gain and power-added efficiency. Additionally, the bandwidth over which the FETs can be matched is reduced.

FIG. 1 shows a conventional parallel-cell device in which FET cells 10A, 10B, 10C and 10D are connected in parallel. FIG. 1 is described using a numerical example in which it is assumed that each of these four FET cells has an input impedance of 5 Ω (ohms) and an output impedance of 25 Ω. The parallel-cell device shown in FIG. 1 would thus have an input impedance of:

$$\frac{1}{1/5 + 1/5 + 1/5 + 1/5} = 1.25 \, \Omega;$$

and an output impedance of:

$$\frac{1}{1/25 + 1/25 + 1/25 + 1/25} = 6.25 \, \Omega.$$

Similarly, if a parallel-cell device such as the one shown in FIG. 1 were used to combine eight FET cells, and each individual FET cell had an input impedance of 5 ohms and an output impedance of 25 ohms, the input impedance and output impedance of the device would be 0.625 Ω and 3.125 Ω, respectively. Thus, it is difficult to achieve a high output power and to impedance match both the input and output of a conventional parallel-cell device such as the one shown in FIG. 1.

Several methods have been employed to combine the power of a plurality of FETs and overcome the problems associated with the parallel-cell device shown in FIG. 1. For example, on the chip level, each FET could be partially matched using either lumped or distributed elements and combined in clusters so that the impedance level could not drop too low and eventually would increase to the system impedance (e.g., 50 Ω). The disadvantages of this approach in solving the problem are that there is a high RF loss and it usually requires a large size. Another approach is to match each FET to 50 Ω on the amplifier level and to combine the individual amplifiers using microwave networks (i.e., Wilkinson combiners, quadrature couplers, or radial combiners). This solution is disadvantageous, however, in that the required area is large and total combining losses can be high.

SUMMARY OF THE INVENTION

An object of the present invention is to combine the power of several FETs (or amplifiers) to achieve high output power.

Another object of the present invention is to impedance match both the input and the output of the power combiner for an arbitrarily large number of devices.

Another object of the present invention is to operate in a high efficiency/high linearity (e.g., class B, push-pull) mode if desired.

Another object of the present invention is to fabricate high power "super" FETs using MMIC techniques.

The above objects of the present invention may be achieved by combining FET cells using several baluns as building blocks. The baluns can be arranged at the cell inputs in a manner such that the input impedance of the power combiner is much larger than the input impedance of a parallel-cell device. The outputs of the FETs can be combined using the same number of baluns as the number of baluns at the inputs of the FETs. Alternatively, a parallel/push-pull connection at the cell outputs may be used so that only a single balun is needed to combine two anti-phase outputs produced as a result of the connection at the cell outputs.

BRIEF DESCRIPTION OF THE DRAWINGS

Other features and advantages of the present invention will be apparent from the following description taken in connection with the accompanying drawings. wherein.

DETAILED DESCRIPTION OF THE PREFERRED EMBODIMENTS

Figure 2:
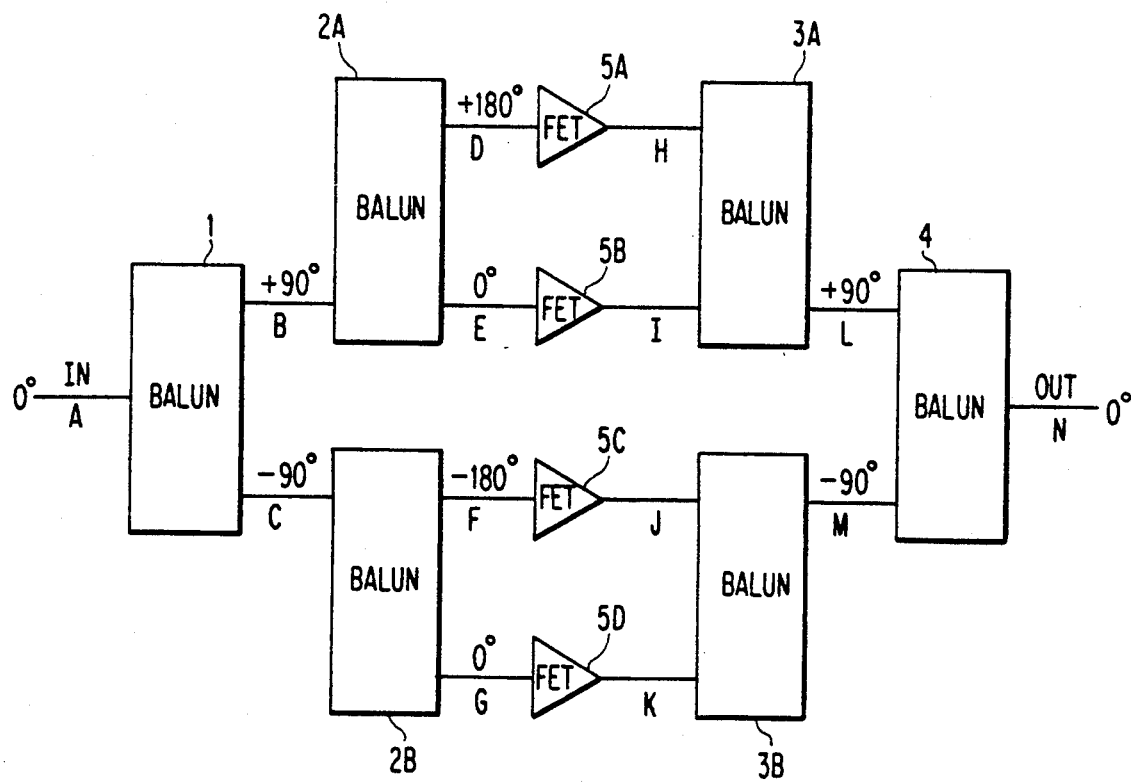
FIG. 2 is a block diagram showing a first embodiment of the present invention.

FIG. 2 shows a block diagram of an RF power combiner according to a first embodiment of the present invention. A plurality of baluns (1, 2A, 2B, 3A, 3B and 4) are used to combine the powers of four FET amplifiers 5A, 5B, 5C and 5D.

As described above, a balun is a circuit which converts a balanced transmission line (such as twinstrip) to an unbalanced transmission line (such as microstrip, CPW or coax). Each of the outputs of a balun have the same amplitude as the other outputs of that balun, however, the outputs of each balun are 180° out of phase from each other. Baluns can be formed using several different methods. However, any balun fulfilling the above requirements may be used in practicing the present invention.

Assuming an input A to balun 1 is at a phase of 0°, balun 1 produces two outputs B and C having phases of +90° and −90°, respectively. Output B of balun 1 is supplied to balun 2A which forms two outputs D and E having phases of +180° and 0°, respectively. Similarly, balun 2B receives output C of balun 1 as an input and forms outputs F and G having phases of −180° and 0°, respectively. FET cells 5A, 5B, 5C and 5D respectively receive outputs D, E, F and G as inputs. The outputs H and I of FET cells 5A and 5B are supplied to balun 3A to produce an output L which is at a phase of +90° (plus or minus a fixed amount due to the transfer phase of the FET cells). Similarly, the outputs J and K of FET cells 5C and 5D are supplied to balun 3B to form an output M which is at −90° (plus or minus the same fixed amount). Outputs L and M are supplied to balun 4 to form an output N having a relative phase of 0°.

Figure 3:
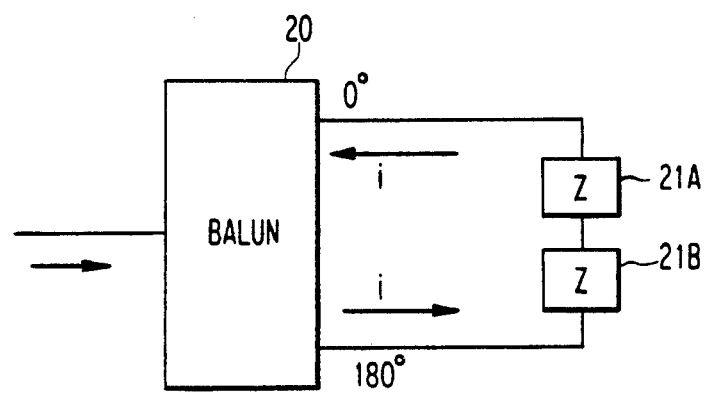
FIG. 3 shows a balun circuit for purposes of describing how the input impedance of a balun is calculated in terms of the output impedances of that balun.

FIG. 3 shows a balun 20 having two impedances Z (21A, 21B) connected between its outputs. Regardless of the phase of the input to any balun (such as balun 20), the output phases will be 180° apart from each other. For example, if the top output of balun 20 will be at a phase of 0°, the bottom output is at a phase of 180° (as shown in FIG. 3). Thus, as far as the balun is concerned, a current i is flowing out of one output and that same current i is flowing into the other output since the two outputs have the same amplitude but are 180° out of phase with each other. Thus, the input impedance of balun 20 is the addition of the two impedances (i.e., $Z+Z=2Z$), since these two impedances 21A and 21B are effectively connected in series. Therefore, the input impedance of any balun is the sum of the two output impedances.

Figure 1:
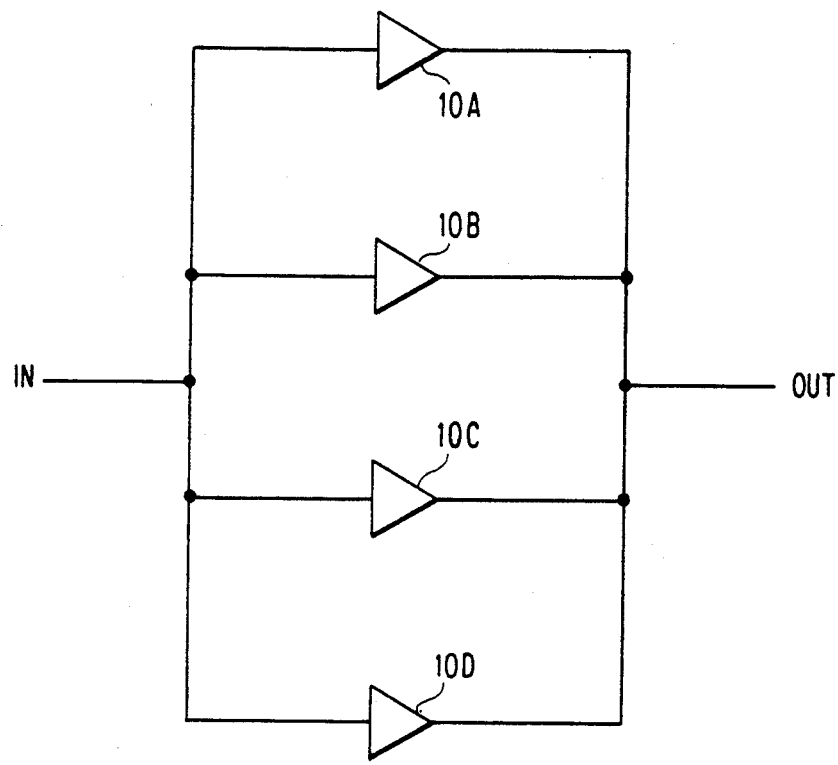
FIG. 1 is a block diagram of a conventional parallel-cell device.

Assuming that each individual FET cell 5A, 5B, 5C and 5D has an input impedance of 5 Ω and an output impedance of 25 Ω, the input impedance and output impedance of the power combiner shown in FIG. 2 can now be calculated. Since the input impedance of each FET cell is 5 Ω, the impedance at each of points B and C in FIG. 2 is 10 Ω. Thus, the input impedance at point A is 20 Ω. Similarly, since the output impedance of each of the FET cells is 25 Ω, the impedance at each of points L and M is 50 Ω and the output impedance at point N is 100 Ω. Thus, the input impedance and the output impedance of the embodiment shown in FIG. 2 are $M^2$ times the input impedance and the output impedance, respectively, of the parallel-cell device shown in FIG. 1, where M is the number of FET cells combined. For example, the input impedance of the power combining device shown in FIG. 2 has an input impedance of 20 Ω which is $M^2=4^2=16$ times (M=4) the input impedance of 1.25 Ω of the parallel-cell device shown in FIG. 1. Similarly, the output impedance of the power combiner shown in FIG. 2 is 100 Ω, which is 16($M^2$) times the output impedance of 6.25 Ω of the parallel-cell device of FIG. 1.

Figure 4:
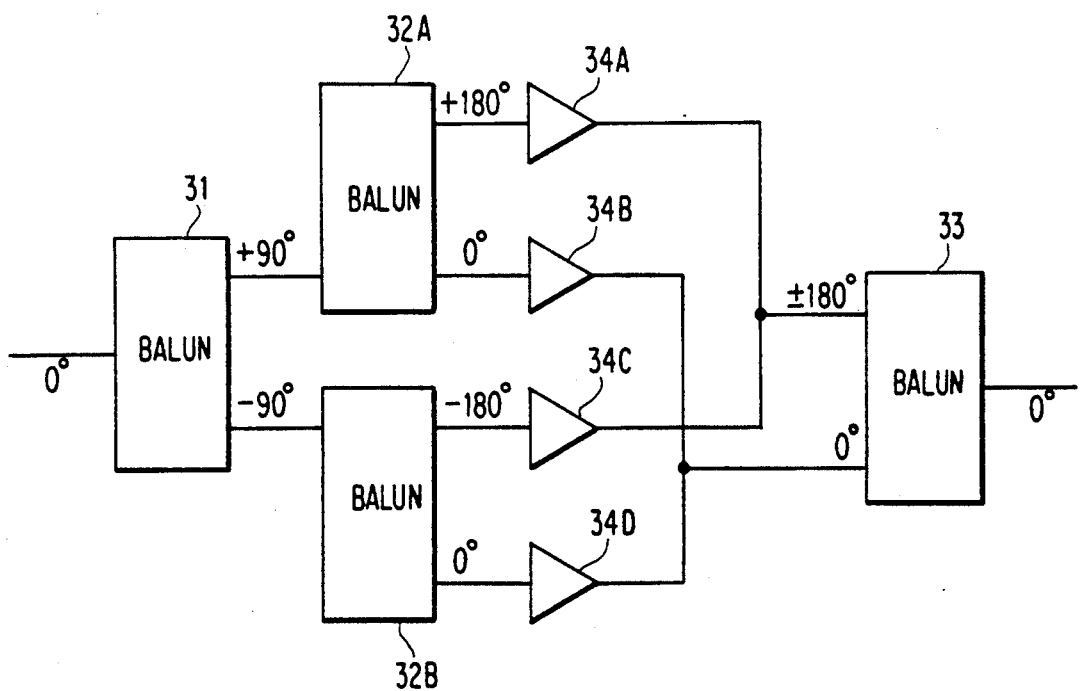
FIG. 4 is a block diagram showing a second embodiment of the present invention.

FIG. 4 shows an RF power combiner according to a second embodiment of the present invention. Baluns 31, 32A and 32B are arranged in the same manner as baluns 1, 2A and 2B shown in FIG. 2. The outputs of baluns 32A and 32B are supplied to the inputs of FET cells 34A, 34B, 34C and 34D in the same way as the output of baluns 2A and 2B are supplied to FET cells 5A, 5B, 5C and 5D in FIG. 2. The outputs of balun 32A are at a phase of +180° and 0° and the outputs of balun 32B are at a phase of −180° and 0°. Adjacent cells in an MMIC usually possess equal transfer phase. Therefore, the outputs of FET cells 34A and 34C are at the same phase. Similarly, the outputs of FET cells 34B and 34D are also at the same phase. Thus, the equi-phase outputs can be connected in parallel to create a single pair of anti-phase signals. These anti-phase signals are supplied to balun 33 which can be either on-chip or off-chip. Balun 33 is not exactly the same as the previously described baluns, however. The output phase of 0° of balun 33 can be obtained by adding an extra amount of transmission line at the output thereof.

Again using the example of individual FET cells having an input impedance of 5 Ω and an output impedance of 25 Ω, the input impedance and output impedance of the power combiner of FIG. 4 can be calculated. The input impedance will be the same as the input impedance of the power combiner of FIG. 2 (i.e., 20 Ω). However, the output impedance will be different. In combining the outputs of FET cells 34A and 34C, the input impedance (on the ±180° phase line) to balun 33 will be:

$$\frac{1}{1/25 + 1/25} = 12.5 \, \Omega$$

Similarly, the input impedance on the 0° input line will be 12.5 Ω. Therefore, the output impedance of the power combiner of FIG. 4 is 25 Ω (as compared to 100 Ω in the FIG. 2 embodiment or 6.25 Ω in the FIG. 1 device).

Figure 5:
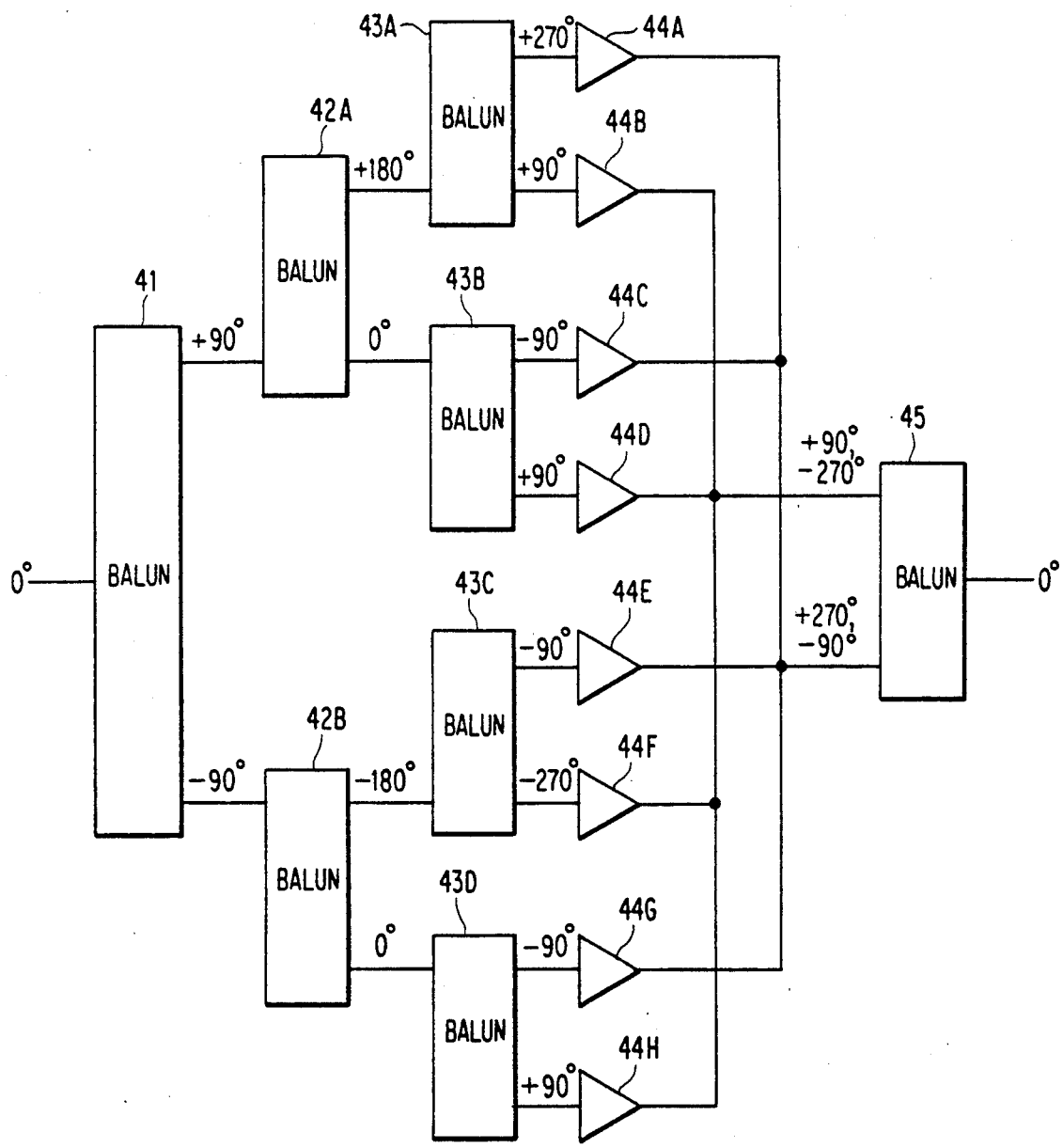
FIG. 5 is a block diagram showing a power combiner according to the second embodiment of the present invention in which the power of eight FET cells is combined.

FIG. 5 shows an RF power combiner in which eight FET cells are combined according to the second embodiment of the present invention. Baluns 41, 42A and 42B are arranged in the same manner as baluns 31, 32A and 32B shown in FIG. 4. The outputs of baluns 42A and 42B are supplied to baluns 43A, 43B, 43C and 43D. The outputs of baluns 43A, 43B, 43C, and 43D are supplied to the inputs of FET cells 44A and 44B, 44C and 44D, 44E and 44F, and 44G and 44H, respectively.

The inputs to FET cells 44A, 44C, 44E and 44G are at the same phase (+270°, −90°). Similarly, the inputs to FET cells 44B, 44D, 44F and 44H are at the same phase (+90°, −270°). Thus, the outputs of FET cells 44A, 44C, 44E and 44G are at the same phase and the outputs of FET cells 44B, 44D, 44F and 44H are at the same phase. Therefore, the outputs of the FET cells can be combined to form a single pair of anti-phase signals as in the FIG. 4 power combiner. These anti-phase signals are supplied to balun 45 which can be either on-chip or off-chip.

Once again using FET cells with an input impedance of 5 Ω and an output impedance of 25 Ω, the input and output impedances of the power combiner can be calculated. The input impedance of the power combiner shown in FIG. 5 can be calculated as follows:

$$[(5+5)+(5+5)]+[(5+5)+(5+5)]=40 \, \Omega.$$

The input impedance to balun 45 on the +90°, −270° phase line will be:

$$\frac{1}{1/25 + 1/25 + 1/25 + 1/25} = 6.25 \, \Omega.$$

Similarly, the input impedance to balun 45 on the +270°, −90° phase line will be 6.25 Ω. Therefore, the output impedance of the power combiner shown in FIG. 5 is 12.5 Ω.

The technique used in FIGS. 4 and 5 can be used to combine the powers of $2^N$ devices, N being an integer. However, when the outputs of FET cells having equal phases are all combined together, the result of the combination will always be two anti-phase outputs which can be combined using a single balun. This approach has two benefits. First, it allows operation in a push-pull mode biased in a class B, AB, or A mode. The higher efficiency capabilities of Class B or AB operation are well known and need not be discussed here. Second, the push-pull combining technique described above allows the input impedance to be $M^2$ ($M=2^N$) times the equivalent-power parallel-cell device while limiting the output transformation to a factor of M. This M:1 transformation ratio for M=4 is close to the typical ratio between input and output impedance for a power FET operating close to saturation. This results in a similar transformed impedance level at the input and output of the power combiner device.

An advantage of this technique is that the output network complexity (i.e.. the number of elements) does not necessarily rise with an increase in the number of cells. Thus, output circuit losses can be minimized and efficiency can be maximized.

What is claimed:

1. A power combiner for combining the power of several devices, comprising:
   distribution means for receiving a power combiner input signal and providing device input signals to each of said several devices, said distribution means comprising at least one balun receiving said power combiner input and providing first and second outputs and at least second and third baluns each receiving one of said first and second outputs, and means for providing said device input signals in response to outputs of said second and third baluns; and
   a single balun for receiving outputs from each of said devices and providing a combined output signal 2. A power combiner as claimed in claim 1, wherein said devices are FETs.

3. A power combiner as claimed in claim 2, wherein said FETs are microwave high power FET amplifiers.

4. A power combiner as claimed in claim 1, wherein outputs of said devices which have equal phases are connected in a parallel/push-pull arrangement.

5. A power combiner as claimed in claim 4, wherein said connection of outputs of said devices having equal phases produce two anti-phase outputs which are combined using said single balun.

6. A power combiner as claimed in claim 1, wherein a number of said devices is four and a number of said baluns connected to inputs of said devices is three.

7. A power combiner as claimed in claim 1, wherein said distribution means comprises (n−1) baluns, where n is an integer greater than 1 and is equal to the number of said devices.

8. A power combiner as claimed in claim 7, wherein n is greater than 2.

9. A power combiner as claimed in claim 1, wherein said providing means comprises at least four baluns.

10. A power combiner as claimed in claim 1, wherein said devices are FET cells.

11. A power combiner for combining the power of n devices, where n is an integer greater than two, said power combiner comprising:
    distribution means for receiving a power combiner input signal and providing device input signals to each of said plural devices, said distribution means comprising (n−1) baluns; and
    a single balun for receiving outputs from each of said devices and providing a combined output signal.

* * * * *